United States Patent
Sha et al.

(10) Patent No.: US 10,599,807 B2
(45) Date of Patent: Mar. 24, 2020

(54) AUTOMATIC GENERATION OF VIA PATTERNS WITH COORDINATE-BASED RECURRENT NEURAL NETWORK (RNN)

(71) Applicant: INTERNATIONAL BUSINESS MACHINES CORPORATION, Armonk, NY (US)

(72) Inventors: Jing Sha, White Plains, NY (US); Michael A. Guillorn, Cold Springs, NY (US); Derren N. Dunn, Sandy Hook, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 5 days.

(21) Appl. No.: 15/994,396

(22) Filed: May 31, 2018

(65) Prior Publication Data
US 2019/0370434 A1 Dec. 5, 2019

(51) Int. Cl.
*G06F 17/50* (2006.01)
*G06N 3/08* (2006.01)
*G06N 3/04* (2006.01)

(52) U.S. Cl.
CPC ........... *G06F 17/5081* (2013.01); *G06N 3/04* (2013.01); *G06N 3/08* (2013.01)

(58) Field of Classification Search
CPC .................................................. G06F 17/5081
USPC ....................................................... 716/110
See application file for complete search history.

(56) References Cited

U.S. PATENT DOCUMENTS

| | | | |
|---|---|---|---|
| 7,930,667 B2 | 4/2011 | Bergman Reuter et al. | |
| 9,122,828 B2 | 9/2015 | Chiang et al. | |
| 9,626,459 B2 | 4/2017 | Agarwal et al. | |
| 9,778,629 B2 | 10/2017 | Venayagamoorthy | |
| 2013/0159948 A1* | 6/2013 | Agarwal | G06F 17/5081 716/112 |
| 2015/0286766 A1 | 10/2015 | Singh et al. | |
| 2016/0180263 A1 | 6/2016 | Mourra | |
| 2016/0328644 A1 | 11/2016 | Lin et al. | |
| 2018/0285510 A1* | 10/2018 | Lutich | G03F 1/36 |
| 2018/0293205 A1* | 10/2018 | Koker | G06F 15/8007 |
| 2019/0147134 A1* | 5/2019 | Wang | G06F 17/5081 |
| 2019/0204755 A1* | 7/2019 | Kicken | G03F 7/70283 |

OTHER PUBLICATIONS

Hamouda et al., "Enhanced OPC Recipe Coverage and Early Hotspot Detection Through Automated Layout Generation and Analysis", Proc. of SPIE, Mar. 2017, pp. 101470R-1-9, vol. 10147.

(Continued)

*Primary Examiner* — Suchin Parihar
(74) *Attorney, Agent, or Firm* — Tutunjian & Bitetto, P.C.; Vazken Alexanian

(57) ABSTRACT

A computer-implemented method, computer program product, a computer processing system are provided for generating synthetic via layout patterns by a Recurrent Neural Network (RNN). The method includes generating, by a processor, a training data set of coordinate arrays that specify coordinates of vias in a set of physical design layouts for a set of integrated circuit elements. The method further includes training, by the processor, the RNN with the training data set of coordinate arrays. The method also includes generating, by the processor, using the RNN, new synthetic via patterns.

20 Claims, 13 Drawing Sheets

(56) References Cited

OTHER PUBLICATIONS

Jeon et al., "Early Stage Hot spot Analysis through Standard cell base random pattern generation", Proc. of SPIE, Apr. 2017, pp. 101480S-1-7, vol. 10148.
Lin et al., "Machine Learning for Mask/Wafer Hotspot Detection and Mask Synthesis", Proc. of SPIE, Oct. 2017, pp. 104510A-1-13, vol. 10451.
Lutich et al., "PatterNet: a system to learn compact physical design pattern representations for pattern-based analytics", J. Micro/ Nanolith. MEMS MOEMS 16(3), 034505, Jul.-Sep. 2017, pp. 1-7.
Neogi et al., "Design Space Analysis of Novel Interconnect Constructs for 22NM FDXTM Technology", Proc. of SPIE, Mar. 2017, pp. 101480Z-1-7, vol. 10148.

* cited by examiner

[$x_1$, $x_2$, $x_3$, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, $y_1$, $y_2$, $y_3$, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0]

[x₁, x₂, x₃, x₄, x₅, x₆, x₇, x₈, x₉, x₁₀, x₁₁, x₁₂, x₁₃, x₁₄, x₁₅, x₁₆, x₁₇, x₁₈, x₁₉, x₂₀, x₂₁, x₂₂, x₂₃, x₂₄, x₂₅, y₁, y₂, y₃, y₄, y₅, y₆, y₇, y₈, y₉, y₁₀, y₁₁, y₁₂, y₁₃, y₁₄, y₁₅, y₁₆, y₁₇, y₁₈, y₁₉, y₂₀, y₂₁, y₂₂, y₂₃, y₂₄, y₂₅]

400

[$x_1, x_2, x_3, 0, 0, 0, 0, 0, 0, 0, 0, 0, x_{13}, x_{14}, x_{15}, x_{16}, 0, 0, 0, 0, 0, 0, 0, 0,$
$y_1, y_2, y_3, 0, 0, 0, 0, 0, 0, 0, 0, 0, y_{13}, y_{14}, y_{15}, y_{16}, 0, 0, 0, 0, 0, 0, 0, 0]$

AUTOMATIC GENERATION OF VIA PATTERNS WITH COORDINATE-BASED RECURRENT NEURAL NETWORK (RNN)

BACKGROUND

Technical Field

The present invention generally relates to semiconductors, and more particularly to automatic generation of via patterns with coordinate-based Recurrent Neural Network (RNN).

Description of the Related Art

In semiconductor design and manufacturing, generating synthetic layout patterns is crucial for early stage hot spot analysis and failure mode analysis, especially when real layout/data is limited.

SUMMARY

According to an aspect of the present invention, a computer-implemented method is provided for generating synthetic via layout patterns by a Recurrent Neural Network (RNN). The method includes generating, by a processor, a training data set of coordinate arrays that specify coordinates of vias in a set of physical design layouts for a set of integrated circuit elements. The method further includes training, by the processor, the RNN with the training data set of coordinate arrays. The method also includes generating, by the processor, using the RNN, new synthetic via patterns.

According to another aspect of the present invention, a computer program product is provided for generating synthetic via layout patterns by a Recurrent Neural Network (RNN). The computer program product includes a non-transitory computer readable storage medium having program instructions embodied therewith. The program instructions are executable by a computer to cause the computer to perform a method. The method includes generating, by a processor, a training data set of coordinate arrays that specify coordinates of vias in a set of physical design layouts for a set of integrated circuit elements. The method further includes training, by the processor, the RNN with the training data set of coordinate arrays. The method also includes generating, by the processor, using the RNN, new synthetic via patterns.

According to yet another aspect of the present invention, a computer processing system is provided for generating synthetic via layout patterns by a Recurrent Neural Network (RNN). The system includes a memory for storing program code. The system further includes a processor, operatively coupled to the memory, for running the program code to generate a training data set of coordinate arrays that specify coordinates of vias in a set of physical design layouts for a set of integrated circuit elements. The processor further runs the program code to train the RNN with the training data set of coordinate arrays. The processor also runs the program code to generate, using the RNN, new synthetic via patterns.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to the automatic generation of via patterns with coordinate-based Recurrent Neural Network (RNN).

In an embodiment, the present invention introduces the conversion of physical design layouts to a data format based on coordinates of vias in the layouts as input for a Recurrent Neural Network (RNN).

In an embodiment, the present invention can generate layout patterns that look like real layouts (samples for training), but not the same, for expanding pattern libraries.

In an embodiment, the present invention enables cumulative learning, such that the RNN model(s) becomes more versatile with more diverse training data (layout patterns).

In an embodiment, the present invention enables ease of data processing, such that a coordinate-based RNN can generate layout patterns with less and/or easier post-processing than image-based neural networks including an RNN.

In an embodiment, one RNN is trained to predict sequences of via coordinates. The trained RNN is then used to generate new data (coordinate arrays). Hence, it is to be appreciated that the coordinate arrays involved in training the RNN are different than the coordinate arrays generated by the RNN.

Figure 1:
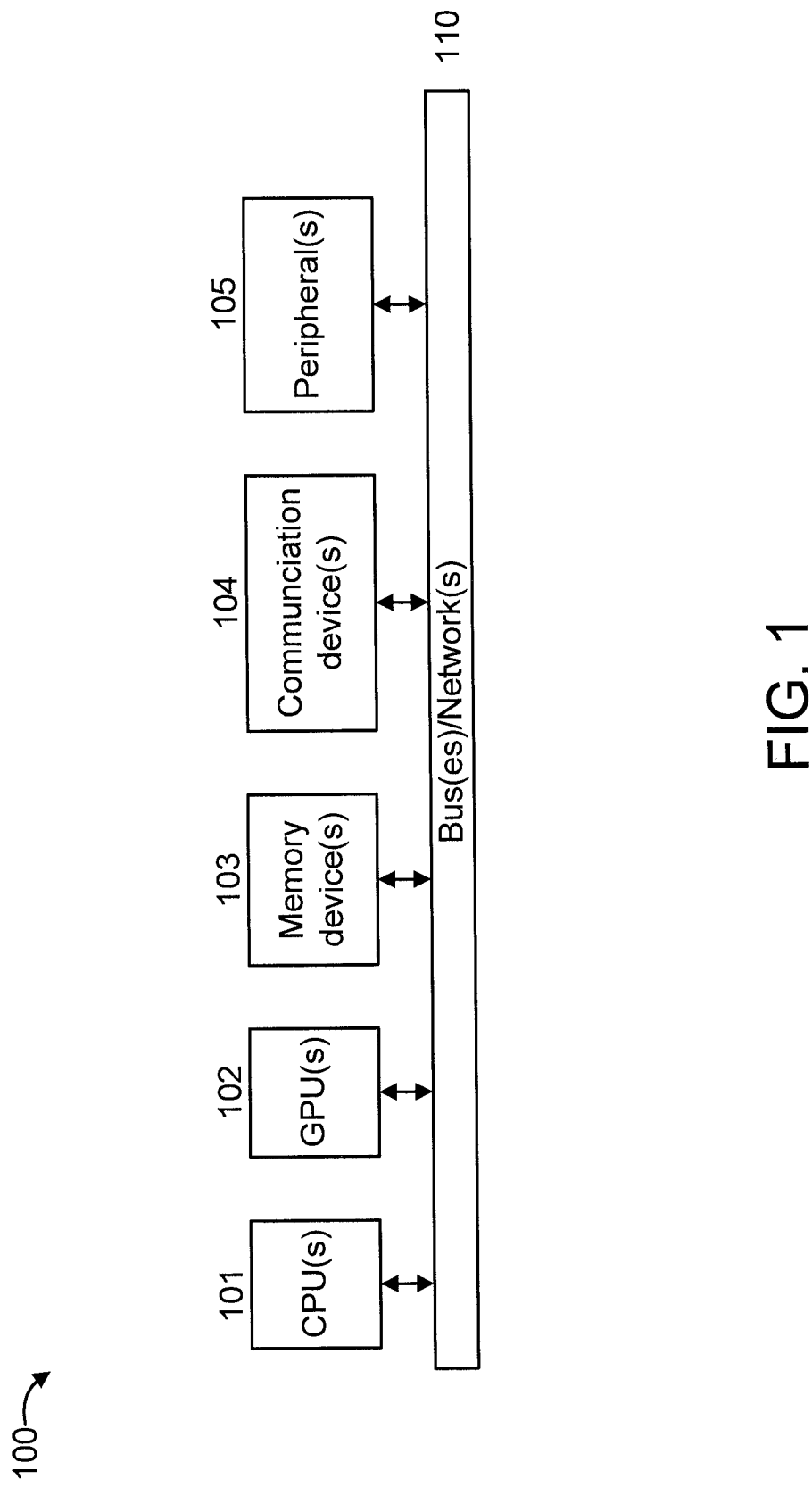
FIG. 1 is a block diagram showing an exemplary processing system to which the present invention may be applied, in accordance with an embodiment of the present invention.

FIG. 1 is a block diagram showing an exemplary processing system 100 to which the present invention may be applied, in accordance with an embodiment of the present invention. The processing system 100 includes a set of processing units (CPUs) 101, a set of GPUs 102, a set of memory devices 103, a set of communication devices 104, and set of peripherals 105. The CPUs 101 can be single or multi-core CPUs. The GPUs 102 can be single or multi-core GPUs. The one or more memory devices 103 can include caches, RAMs, ROMs, and other memories (flash, optical, magnetic, etc.). The communication devices 104 can include wireless and/or wired communication devices (e.g., network (e.g., WIFI, etc.) adapters, etc.). The peripherals 105 can include a display device, a user input device, a printer, and so forth. Elements of processing system 100 are connected by one or more buses or networks (collectively denoted by the figure reference numeral 110).

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. Further, in another embodiment, a cloud configuration can be used (e.g., see FIGS. 12-13). These and other variations of the processing system 100 are readily contemplated by one of ordinary skill in the art given the teachings of the present invention provided herein.

Part or all of processing system 100 may be implemented in one or more of the elements of the architectures and/or workflows described herein. Similarly, part or all of processing system may be implemented in one or more of the elements of the cloud computing environment 1200 of FIG. 12.

Figure 2:
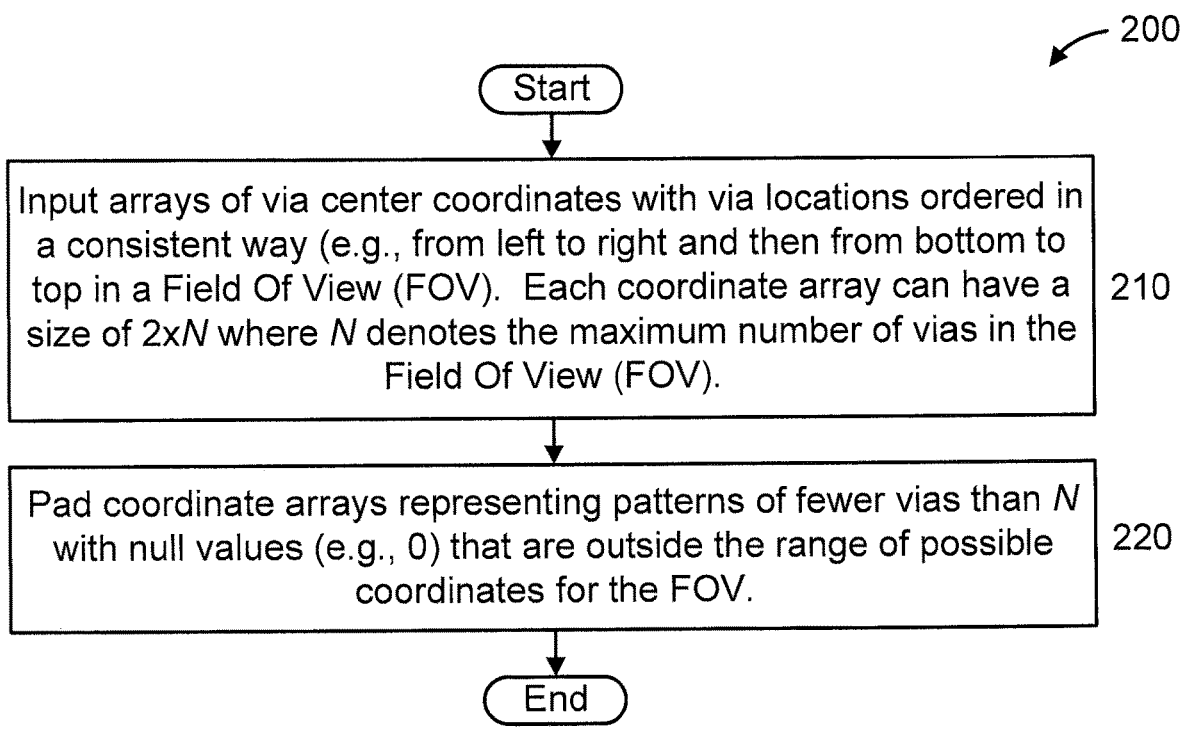
FIG. 2 is a flow diagram showing an exemplary method for preparing data for a Recurrent Neural Networks (RNN) for automatic generation of via patterns, in accordance with an embodiment of the present invention.
Figure 6:
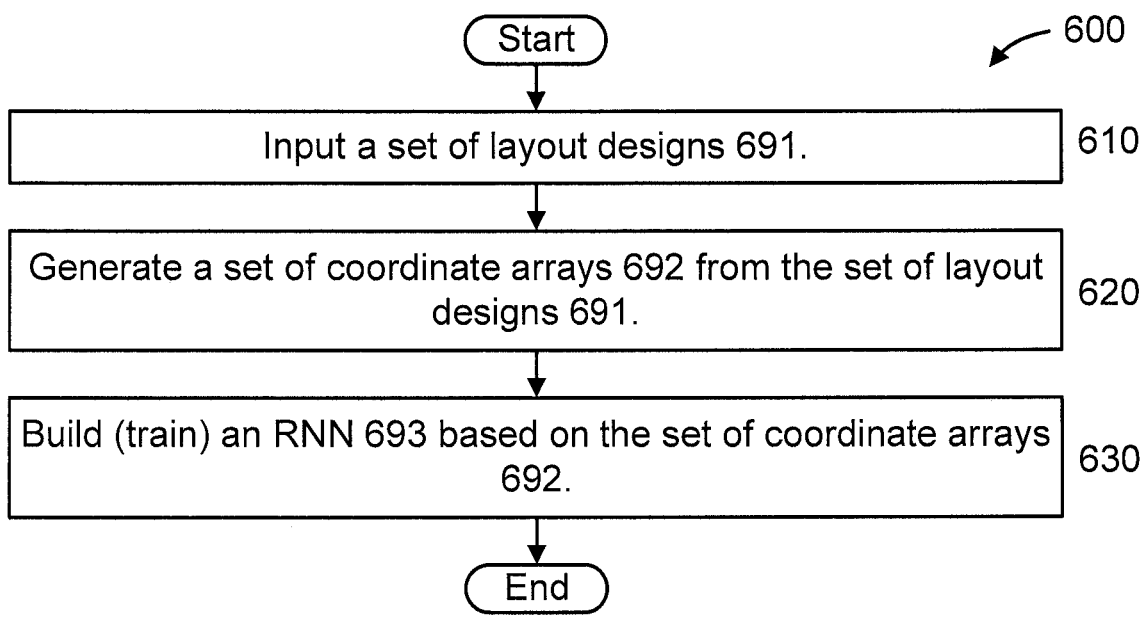
FIG. 6 is a flow diagram showing an exemplary training workflow for training a coordinate-based RNN to automatically generate via patterns, in accordance with an embodiment of the present invention.
Figure 8:
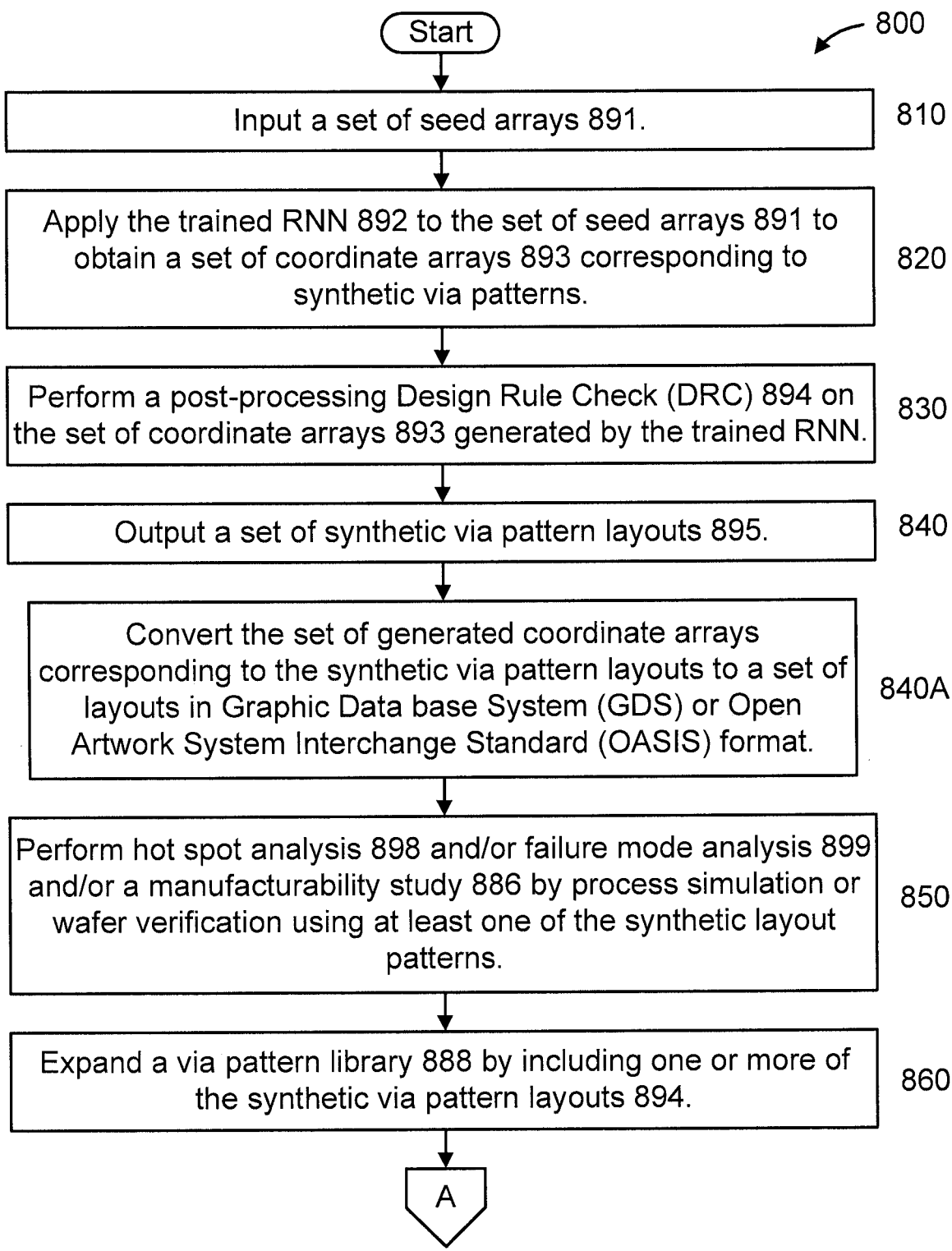
FIGS. 8-9 are flow diagrams showing an exemplary inference workflow for automatically generating via patterns by a coordinate-based RNN, in accordance with an embodiment of the present invention.
Figure 9:
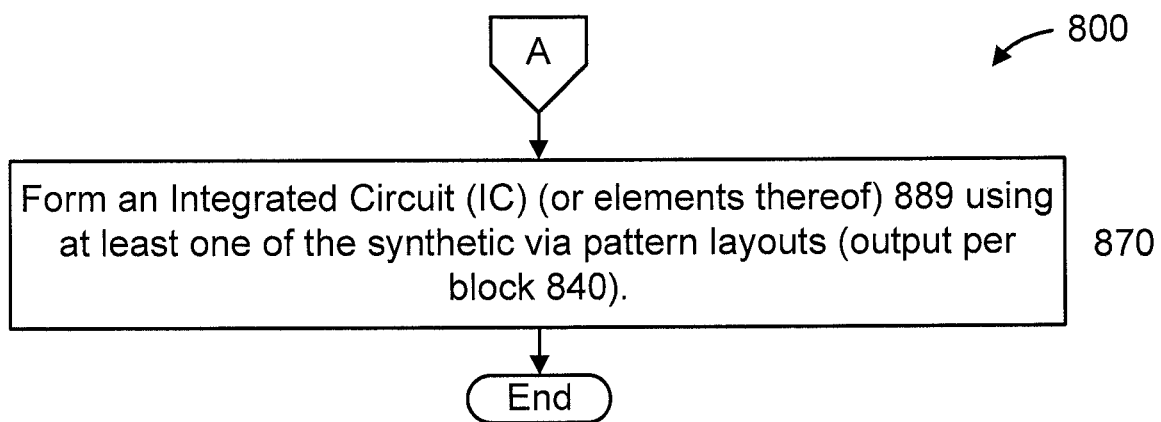

Further, it is to be appreciated that processing system 100 may perform at least part of the methods described herein including, for example, at least part of method 200 of FIG. 2 and/or at least part of the method of FIG. 6 and/or at least part of the method of FIGS. 8-9. Similarly, cloud computing environment 1200 may perform at least part of the methods described herein including, for example, at least part of method 200 of FIG. 2 and/or at least part of the method of FIG. 6 and/or at least part of the method of FIGS. 8-9.

FIG. 2 is a flow diagram showing an exemplary method 200 for preparing data for a Recurrent Neural Network (RNN) for automatic generation of via patterns, in accordance with an embodiment of the present invention.

At block 210, input arrays of via center coordinates with via locations ordered in a consistent way. For example, in an embodiment, the ordering can be from left to right and then from bottom to top in a Field Of View (FOV). Of course, other consistent orderings can also be used. Each coordinate array can have a size of 2×N where N denotes the maximum number of vias in the FOV. In an embodiment, the arrays are provided as training data to an RNN model which can generates coordinate for synthetic via patterns after training. In an embodiment, the center coordinates are of polygons representative of vias.

At block 220, pad arrays representing patterns with fewer vias than N with null values (e.g., 0), which are outside the range of possible via coordinates.

Figure 3:
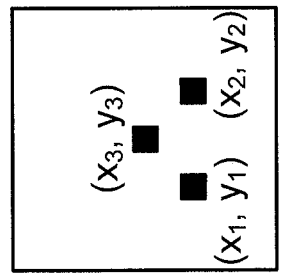
FIG. 3 is a block diagram showing an exemplary data conversion between a pattern of a maximum of 25 vias and a coordinate array, in accordance with an embodiment of the present invention.
Figure 4:
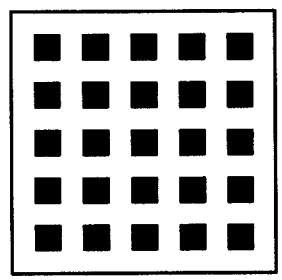
FIG. 4 is a block diagram showing another exemplary data conversion between a pattern of a maximum of 25 vias and a coordinate array, in accordance with an embodiment of the present invention.

FIGS. 3-4 below show exemplary data conversions 300 and 400, respectively, from a respective layout to a respective coordinate array, in accordance with various embodiments of the present invention. Each respective coordinate array has a size of 2×25, where the first 25 values are for x coordinates and the second 25 values are for y coordinates. The arrays that represent patterns with fewer vias than the maximum possible (25 in these examples) are padded with null values (e.g., 0), which are outside the range of possible via coordinates.

FIG. 3 is a block diagram showing an exemplary data conversion 500 between a pattern of a maximum of 25 vias and a coordinate array, in accordance with an embodiment of the present invention. In the example of FIG. 3, the data conversion 300 involves a layout pattern of 3 vias.

FIG. 4 is a block diagram showing another exemplary data conversion 400 between a pattern of a maximum of 25 vias and a coordinate array, in accordance with an embodiment of the present invention. In the example of FIG. 4, the data conversion 400 involves a layout pattern of 25 vias.

Figure 5:
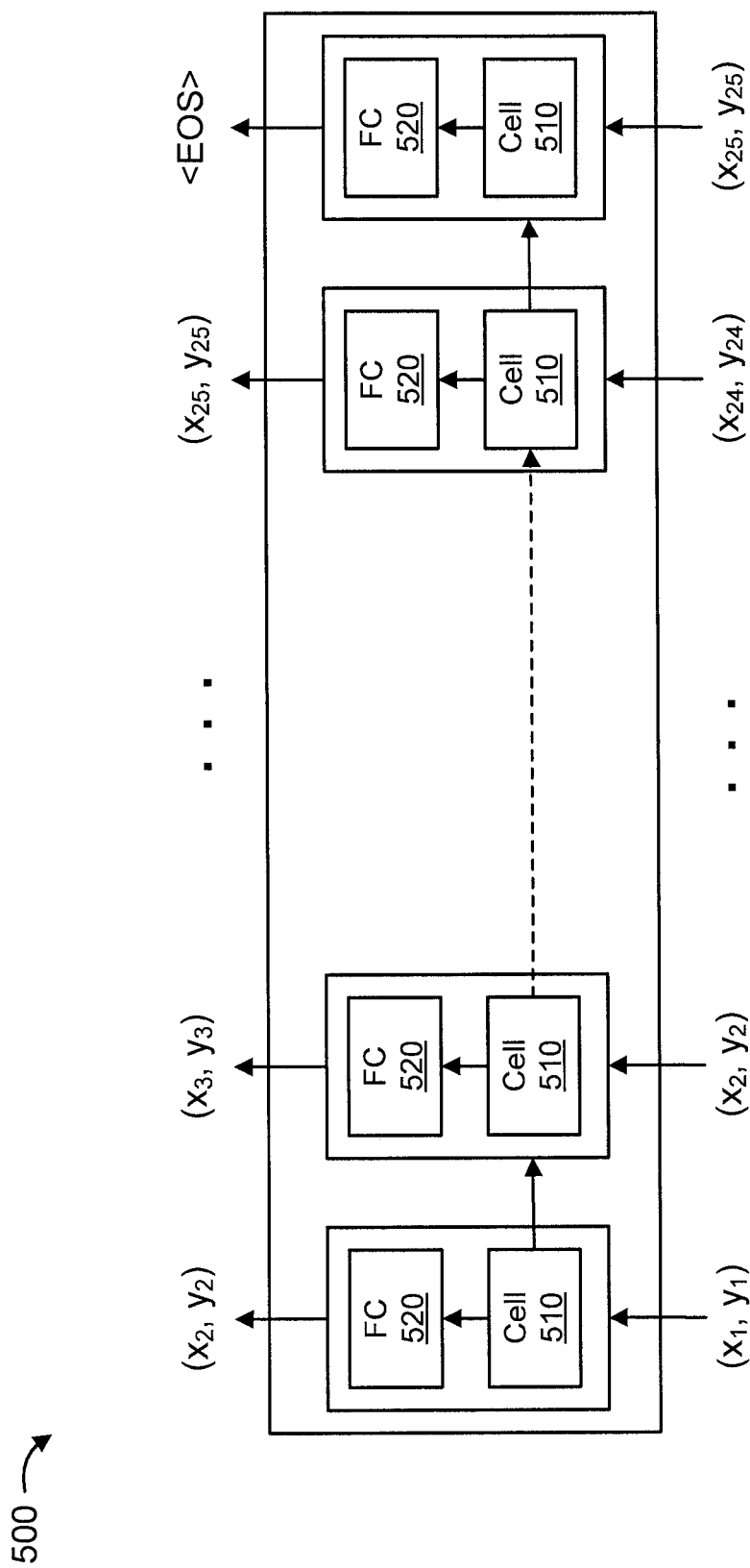
FIG. 5 is a block diagram showing an exemplary Recurrent Neural Network (RNN) architecture unrolled through "time", to which the present invention can be applied, in accordance with an embodiment of the present invention.

FIG. 5 is a block diagram showing an exemplary Recurrent Neural Network (RNN) architecture 500 unrolled through "time", to which the present invention can be applied, in accordance with an embodiment of the present invention. The RNN architecture shown represents a single layer, unrolled through time.

The RNN architecture 500 includes a set of Long Short-Term Memory (LSTM) or Gated Recurrent Unit (GRU) cells 510. Each of the cells is connected to a Fully Connected (FC) layer 520. It is to be appreciated that in other embodiments, such as those involving more complex architectures, multiple LSTMs or GRU cells can be stacked on top of each other. These and other variations of an RNN architecture 500 to which the present invention can be applied are readily determined, given the teachings of the present invention provided herein, while maintaining the spirit of the present invention.

The input to the RNN architecture 500 can be a sequence of via coordinates starting at x(t). The output from the RNN architecture 500 can be the same sequence of via coordinates starting at x(t+1). As can be seen, the output of an RNN cell at sequence step t is fed back to the cell as the input at sequence step t+1 and so on until the End Of Sequence (EOS) is reached.

Figure 7:
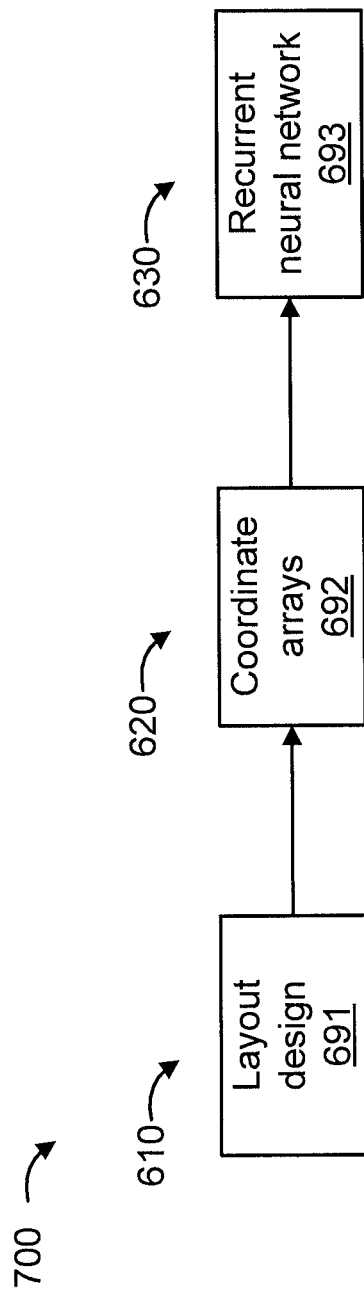
FIG. 7 is a block diagram showing the pipeline for the training workflow of FIG. 6, in accordance with an embodiment of the present invention.

FIG. 6 is a flow diagram showing an exemplary training workflow 600 for training a coordinate-based RNN to automatically generate via patterns, in accordance with an embodiment of the present invention. FIG. 7 is a block diagram showing the pipeline 700 for the training workflow 600 of FIG. 6, in accordance with an embodiment of the present invention.

At block 610, input a set of layout designs 691. The layout designs 691 can include a variety of patterns for training neural network models. In an embodiment, the layout designs 691 can be in one format such as, for example, but not limited to, Graphic Data base System (GDS) or Oasis (OAS).

At block 620, generate a set of coordinate arrays 692 from the set of layout designs 691. The set of coordinate arrays 692 are generated for RNN model training.

At block 630, build (train) an RNN 693 based on the set of coordinate arrays 692.

Figure 10:
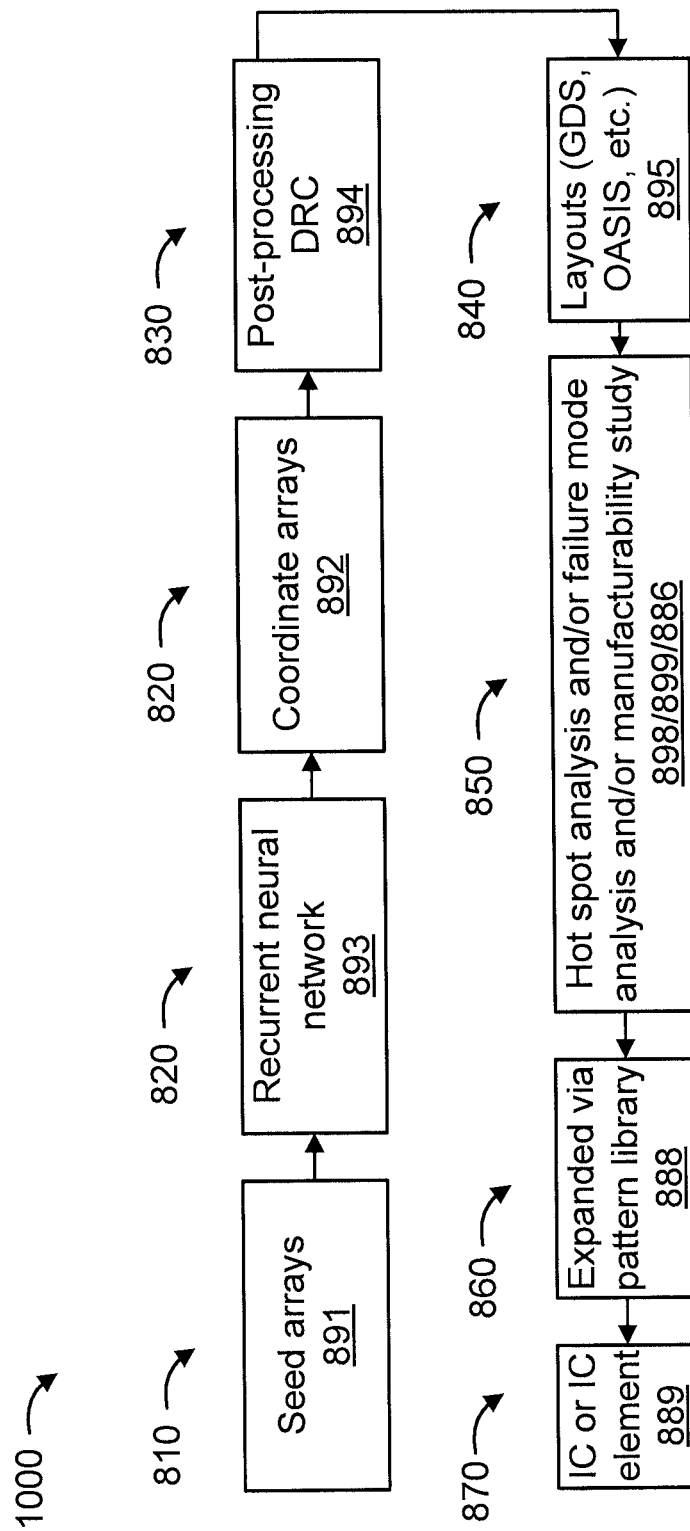
FIG. 10 is a block diagram showing the pipeline for the inference workflow of FIGS. 8-9, in accordance with an embodiment of the present invention.

FIGS. 8-9 are flow diagrams showing an exemplary inference workflow 800 for automatically generating via patterns by the trained RNN, in accordance with an embodiment of the present invention. FIG. 10 is a block diagram showing the pipeline 1300 for the inference workflow 800 of FIGS. 8-9, in accordance with an embodiment of the present invention.

At block 810, input a set of seed arrays 891. In an embodiment, the seed arrays 891 can, for example, be arrays of random numbers corresponding to via coordinates in the FOV.

At block 820, apply the trained RNN 892 to the set of seed arrays 891 to obtain a set of coordinate arrays 893 corresponding to synthetic via patterns. It is to be appreciated the set of coordinate arrays 893 from the inference workflow 800 are different than the set of coordinate arrays 692 from the training workflow 600.

At block 830, perform a post-processing Design Rule Check (DRC) 894 on the set of coordinate arrays 893 generated by the trained RNN. The DRC 894 may ensure that the synthetic coordinate arrays meet specified design rules for layout patterns in a particular use case that may not be captured during training. In some embodiments, via sizes are assumed to be fixed (e.g., known width and height), and thus the DRC includes determining whether the center coordinates of the vias in the synthetic coordinate arrays violate any design rules. For example, this may include checking whether the absolute distance between the x- or y-coordinates of two features exceed some designated threshold, or that abs(x1-x2)>xthreshold or abs (y1-y2)>ythreshold.

At block 840, output a set of synthetic via pattern layouts 895. The output synthetic via pattern layouts 895 are realistic and resemble actual (real) layouts versus random layout patterns.

In an embodiment, block 840 can include block 840A.

At block 840A, convert the set of generated coordinate arrays corresponding to the synthetic via pattern layouts to a set of layouts in Graphic Data base System (GDS) or Open Artwork System Interchange Standard (OASIS) format.

It is to be appreciated that while block 840A mentions GDS and OASIS, other formats can also be used while maintaining the spirit of the present invention.

At block 850, perform hot spot analysis 898 and/or failure mode analysis 899 and/or a manufacturability study 886 by process simulation or wafer verification using at least one of the synthetic layout patterns.

At block 860, expand a via pattern library 888 by including one or more of the synthetic via pattern layouts 894. The included via patterns may themselves be expansions of training patterns used to train the RNN.

At block 870, form an Integrated Circuit (IC) (or elements thereof) 889 using at least one of the synthetic via pattern layouts (output per block 840).

Hence, as described above, various embodiments of the present invention involve Recurrent Neural Networks (RNNs). A RNN is composed of neurons receiving inputs, producing outputs, and sending the outputs back to themselves.

At each time step t, a simply recurrent neuron receives the inputs (x(t) as well as its own from the previous time step y(t−1)).

It is to be appreciated that RNN architectures (e.g. RNN unit cells, etc.) and corresponding hyperparameters can vary case by case. Such hyperparameters can include, but are not limited to, the number of neural network layers, the number of neurons for each neural network layer, and so forth. The types of RNN unit cells can include, but are not limited to, Long Short-Term Memory (LSTM) cells, Gated Recurrent Unit (GRU) cells, and so forth. Case by case variance can be based on, but not limited to, the input polygon coordinates of the layouts, a training accuracy target(s), computing hardware, etc.).

It is to be further appreciated that while the present invention has been described as involving vias of a single size, in other embodiments, the present invention can be used with respect to different size vias. For this extension of the present invention to multiple via sizes, the coordinate arrays are arranged slightly differently. For example, a coordinate array can have via of one size in a particular bundle and vias in another size(s) in a different bundle(s).

Figure 11:
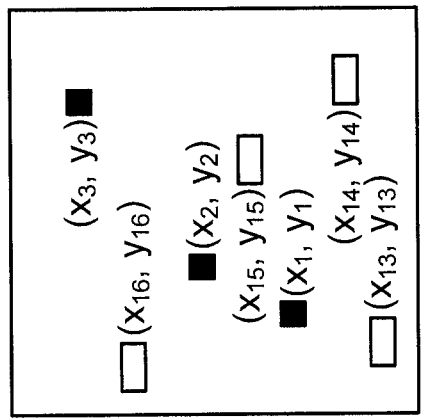
FIG. 11 is a block diagram showing yet another exemplary data conversion between a pattern of a maximum of 25 vias of more than one size and a coordinate array, in accordance with an embodiment of the present invention.

FIG. 11 is a block diagram showing yet another exemplary data conversion 1100 between a pattern of a maximum of 25 vias of more than one size (2 in this case) and a coordinate array, in accordance with an embodiment of the present invention. In the example of FIG. 11, the data conversion 1100 involves a layout pattern of 7 vias of two different sizes, namely small and large. In particular, the data conversion involves a layout of 3 (small) vias and 4 (large) vias. In FIG. 11, the small vias are shown with fill (i.e., shaded), while the large vias are shown without fill (i.e., unshaded). In FIG. 11, the first 12 coordinates on each line correspond to the small vias, while the following 13 coordinates on each line correspond to the large vias. As can be seen, the small vias are bundled together and the large vias are bundled together. Padding applies similarly when the number of vias of each size is smaller than the array size.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 12:
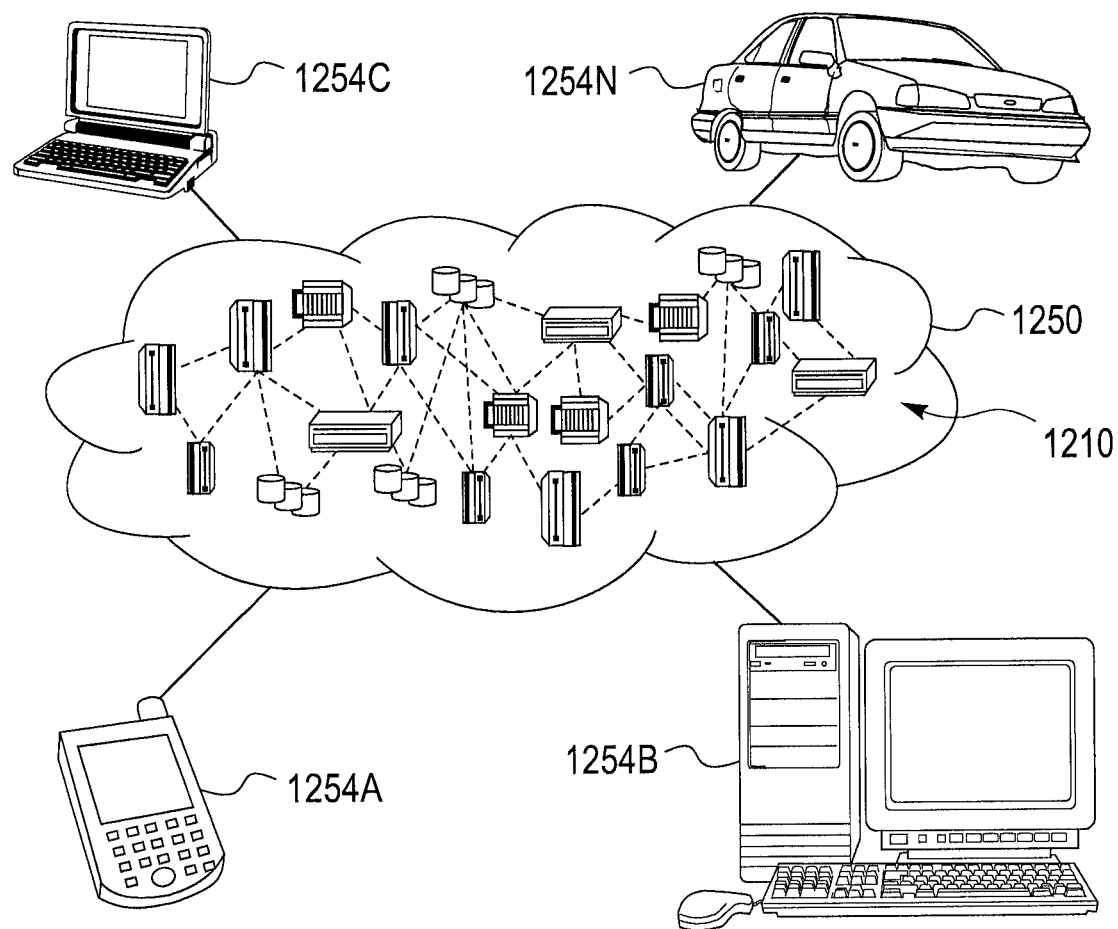
FIG. 12 is a block diagram showing an illustrative cloud computing environment having one or more cloud computing nodes with which local computing devices used by cloud consumers communicate in accordance with one embodiment.

Referring now to FIG. 12, illustrative cloud computing environment 1250 is depicted. As shown, cloud computing environment 1250 includes one or more cloud computing nodes 1210 with which local computing devices used by cloud consumers, such as, for example, personal digital assistant (PDA) or cellular telephone 1254A, desktop computer 1254B, laptop computer 1254C, and/or automobile computer system 1254N may communicate. Nodes 1210 may communicate with one another. They may be grouped (not shown) physically or virtually, in one or more networks, such as Private, Community, Public, or Hybrid clouds as described hereinabove, or a combination thereof. This allows cloud computing environment 1250 to offer infrastructure, platforms and/or software as services for which a cloud consumer does not need to maintain resources on a local computing device. It is understood that the types of computing devices 1254A-N shown in FIG. 12 are intended to be illustrative only and that computing nodes 1210 and cloud computing environment 1250 can communicate with any type of computerized device over any type of network and/or network addressable connection (e.g., using a web browser).

Figure 13:
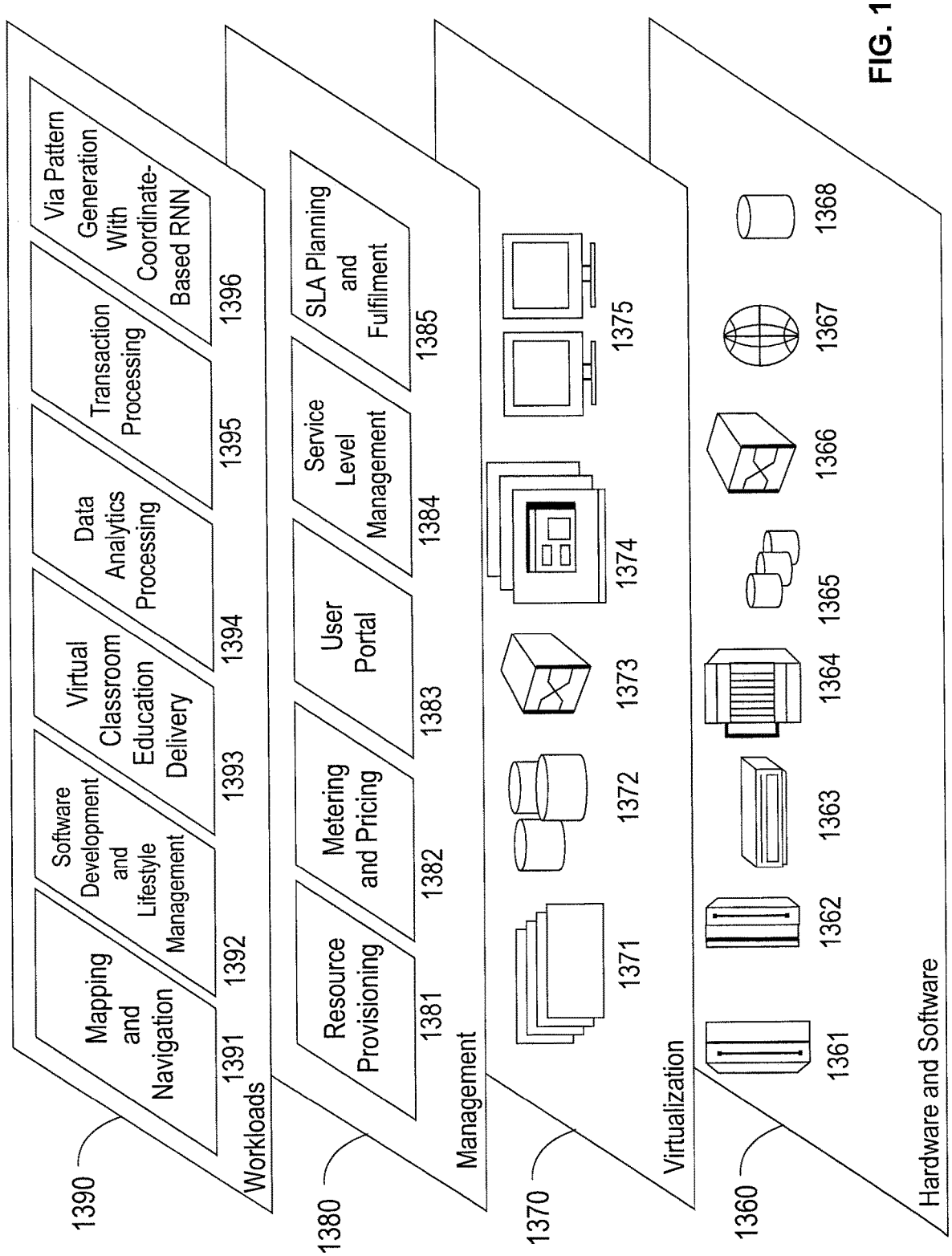
FIG. 13 is a block diagram showing a set of functional abstraction layers provided by a cloud computing environment in accordance with one embodiment.

Referring now to FIG. 13, a set of functional abstraction layers provided by cloud computing environment 1250 (FIG. 12) is shown. It should be understood in advance that the components, layers, and functions shown in FIG. 13 are intended to be illustrative only and embodiments of the invention are not limited thereto. As depicted, the following layers and corresponding functions are provided:

Hardware and software layer 1360 includes hardware and software components. Examples of hardware components include: mainframes 1361; RISC (Reduced Instruction Set Computer) architecture based servers 1362; servers 1363; blade servers 1364; storage devices 1365; and networks and networking components 1366. In some embodiments, software components include network application server software 1367 and database software 1368.

Virtualization layer 1370 provides an abstraction layer from which the following examples of virtual entities may be provided: virtual servers 1371; virtual storage 1372; virtual networks 1373, including virtual private networks; virtual applications and operating systems 1374; and virtual clients 1375.

In one example, management layer 1380 may provide the functions described below. Resource provisioning 1381 provides dynamic procurement of computing resources and other resources that are utilized to perform tasks within the cloud computing environment. Metering and Pricing 1382 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1383 provides access to the cloud computing environment for consumers and system administrators. Service level management 1384 provides cloud computing resource allocation and management such that required service levels are met. Service Level Agreement (SLA) planning and fulfillment 1385 provide pre-arrangement for, and procurement of, cloud computing resources for which a future requirement is anticipated in accordance with an SLA.

Workloads layer 1390 provides examples of functionality for which the cloud computing environment may be utilized. Examples of workloads and functions which may be provided from this layer include: mapping and navigation 1391; software development and lifecycle management 1392; virtual classroom education delivery 1393; data analytics processing 1394; transaction processing 1395; and via pattern generation with coordinate-based RNN The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A computer-implemented method for generating synthetic via layout patterns by a coordinate-based Recurrent Neural Network (RNN), the method comprising:
   generating, by a processor, a training data set of coordinate arrays that specify coordinates of vias in a set of physical design layouts for a set of integrated circuit elements;
   training, by the processor, the coordinate-based RNN with the training data set of coordinate arrays; and
   generating, by the processor, using the coordinate-based RNN, new synthetic via patterns.

2. The computer-implemented method of claim 1, further comprising manufacturing an integrated circuit using at least one of the new synthetic via patterns.

3. The computer-implemented method of claim 1, wherein at least one of the new synthetic via patterns comprises a new pattern relative to one or more training patterns generated by the coordinate-based RNN during said training step.

4. The computer-implemented method of claim 1, wherein the set of coordinate arrays are configured as training data for the coordinate-based RNN.

5. The computer-implemented method of claim 1, wherein the coordinate arrays specify the center coordinates of the vias in the set of physical design layouts for the integrated circuit.

6. The computer-implemented method of claim 1, further comprising padding any of coordinate arrays having less than a maximum possible number of vias.

7. The computer-implemented method of claim 1, further comprising performing a design or mask rule checking process on the new synthetic via patterns.

8. The computer-implemented method of claim 1, further comprising converting the new synthetic via patterns having a coordinate basis to another pattern format having a layout basis.

9. The computer-implemented method of claim 1, wherein the coordinate-based RNN uses seed arrays of random numbers for pattern generation and extension relative to one or more training patterns generated by the coordinate-based RNN during said training step.

10. The computer-implemented method of claim 1, further comprising performing a manufacturability study by process simulation or wafer verification of the new synthetic via patterns.

11. The computer-implemented method of claim 1, further comprising:
   performing a failure mode analysis on a set of integrated circuits using at least one of the new synthetic via patterns; and
   modifying the at least one of the new synthetic via patterns to correct a failure identified by the failure mode analysis.

12. A computer program product for generating synthetic via layout patterns by a coordinate-based Recurrent Neural Network (RNN), the computer program product comprising a non-transitory computer readable storage medium having program instructions embodied therewith, the program instructions executable by a computer to cause the computer to perform a method comprising:

generating, by a processor, a training data set of coordinate arrays that specify coordinates of vias in a set of physical design layouts for a set of integrated circuit elements;

training, by the processor, the coordinate-based RNN with the training data set of coordinate arrays; and generating, by the processor, using the coordinate-based RNN, new synthetic via patterns.

13. The computer program product of claim 12, wherein the method further comprises manufacturing an integrated circuit using at least one of the new synthetic via patterns.

14. The computer program product of claim 12, wherein at least one of the new synthetic via patterns comprises a new pattern relative to the training data set of coordinate arrays.

15. The computer program product of claim 12, wherein the set of coordinate arrays are used as training data for training the coordinate-based RNN.

16. The computer program product of claim 12, wherein the coordinate arrays specify the center coordinates of the vias in the set of physical design layouts for the integrated circuit.

17. The computer program product of claim 12, wherein the method further comprises padding any of coordinate arrays having less than a maximum possible number of vias.

18. The computer program product of claim 12, wherein the method further comprises performing a design or mask rule checking process on the new synthetic via patterns.

19. The computer program product of claim 12, wherein the method further comprises converting the new synthetic via patterns having a coordinate basis to another pattern format having a layout basis.

20. A computer processing system for generating synthetic via layout patterns by a coordinate-based Recurrent Neural Network (RNN), the system comprising:

a memory for storing program code; and a processor, operatively coupled to the memory, for running the program code to generate a training data set of coordinate arrays that specify coordinates of vias in a set of physical design layouts for a set of integrated circuit elements;

train the coordinate-based RNN with the training data set of coordinate arrays; and generate, using the coordinate-based RNN, new synthetic via patterns.

* * * * *